United States Patent
Wirth

(10) Patent No.: US 9,062,378 B2
(45) Date of Patent: Jun. 23, 2015

(54) COMPOSITIONS FOR THE CURRENTLESS DEPOSITION OF TERNARY MATERIALS FOR USE IN THE SEMICONDUCTOR INDUSTRY

(75) Inventor: Alexandra Wirth, Eckental (DE)

(73) Assignee: BASF AKTIENGESELLSCHAFT, Ludwigshafen (DE)

( * ) Notice: Subject to any disclaimer, the term of this patent is extended or adjusted under 35 U.S.C. 154(b) by 1136 days.

(21) Appl. No.: 12/916,887

(22) Filed: Nov. 1, 2010

(65) Prior Publication Data

US 2011/0124191 A1    May 26, 2011

(30) Foreign Application Priority Data

May 9, 2003   (DE) ................................. 103 21 113
Oct. 10, 2003  (DE) ................................. 103 47 809

(51) Int. Cl.
  *H01L 21/768*   (2006.01)
  *C23C 10/50*    (2006.01)
  *C23C 18/50*    (2006.01)
  *H01L 21/288*   (2006.01)
  *H01L 23/532*   (2006.01)

(52) U.S. Cl.
  CPC .............. *C23C 18/50* (2013.01); *H01L 21/288* (2013.01); *H01L 23/53238* (2013.01); *H01L 21/76843* (2013.01); *H01L 21/76849* (2013.01); *H01L 2924/0002* (2013.01)

(58) Field of Classification Search
  USPC ......................................................... 438/653
  See application file for complete search history.

(56) References Cited

U.S. PATENT DOCUMENTS

| | | | | |
|---|---|---|---|---|
| 3,011,920 A * | 12/1961 | Shipley, Jr. | .................. | 106/1.11 |
| 3,485,597 A * | 12/1969 | Pearlstein | ..................... | 428/649 |
| 3,674,516 A | 7/1972 | Kovac | | |
| 4,019,910 A * | 4/1977 | Mallory, Jr. | .................. | 106/1.23 |
| 4,397,812 A * | 8/1983 | Mallory, Jr. | .................. | 420/441 |
| 4,983,428 A | 1/1991 | Hodgens, II | | |
| 5,614,003 A | 3/1997 | Mallory | | |
| 5,695,810 A | 12/1997 | Dubin et al. | | |
| 5,969,422 A * | 10/1999 | Ting et al. | ..................... | 257/762 |
| 6,060,176 A * | 5/2000 | Semkow et al. | .............. | 428/620 |
| 6,335,104 B1 * | 1/2002 | Sambucetti et al. | .......... | 428/615 |

(Continued)

FOREIGN PATENT DOCUMENTS

| JP | 59-227103 | 12/1984 |
|---|---|---|
| JP | 04297001 A | 10/1992 |

(Continued)

OTHER PUBLICATIONS

English translation of JP 04/297001, Oct. 1992, 28 pages.

(Continued)

*Primary Examiner* — Eva Y Montalvo
*Assistant Examiner* — Grant Withers
(74) *Attorney, Agent, or Firm* — Oblon, McClelland, Maier & Neustadt, L.L.P.

(57) ABSTRACT

The present invention relates to the use of ternary nickel-containing metal alloys of the NiMR type (where M=Mo, W, Re or Cr, and R=B or P) deposited by an electroless process in semiconductor technology. In particular, the present invention relates to the use of these deposited ternary nickel-containing metal alloys as barrier material or as selective encapsulation material for preventing the diffusion and electromigration of copper in semiconductor components.

21 Claims, 5 Drawing Sheets

Diagrammatic representation of the selective encapsulation process on Cu surfaces via Pd nuclei activation or by the direct route without the intermediate step of Pd nucleus activation including surface pretreatment

(56) References Cited

U.S. PATENT DOCUMENTS

| | | | |
|---|---|---|---|
| 6,528,409 B1 | 3/2003 | Lopatin et al. | |
| 6,638,564 B2 | 10/2003 | Segawa et al. | |
| 6,911,067 B2* | 6/2005 | Kolics et al. | 106/1.22 |
| 7,655,081 B2* | 2/2010 | Dai et al. | 106/1.22 |
| 7,850,770 B2* | 12/2010 | Wirth | 106/1.22 |
| 8,586,133 B2* | 11/2013 | Ivanov et al. | 427/97.6 |
| 2002/0036143 A1* | 3/2002 | Segawa et al. | 205/187 |
| 2002/0098681 A1 | 7/2002 | Hu et al. | |
| 2002/0185658 A1* | 12/2002 | Inoue et al. | 257/200 |
| 2003/0111729 A1* | 6/2003 | Leu et al. | 257/758 |
| 2003/0113576 A1* | 6/2003 | Chebiam et al. | 428/670 |
| 2004/0119134 A1* | 6/2004 | Goldberg et al. | 257/508 |
| 2004/0137161 A1* | 7/2004 | Segawa et al. | 427/430.1 |
| 2004/0142114 A1* | 7/2004 | Kong et al. | 427/443.1 |
| 2004/0219298 A1* | 11/2004 | Fukunaga et al. | 427/304 |
| 2005/0014359 A1* | 1/2005 | Segawa et al. | 438/622 |
| 2005/0095830 A1* | 5/2005 | Weidman et al. | 438/584 |
| 2005/0101130 A1* | 5/2005 | Lopatin et al. | 438/678 |
| 2005/0124158 A1* | 6/2005 | Lopatin et al. | 438/686 |
| 2006/0134911 A1* | 6/2006 | Restaino et al. | 438/678 |
| 2006/0223301 A1* | 10/2006 | Vanhaelemeersch et al. | 438/618 |
| 2007/0066059 A1* | 3/2007 | Chen et al. | 438/678 |
| 2008/0067679 A1* | 3/2008 | Takagi et al. | 257/751 |
| 2013/0202910 A1* | 8/2013 | Koppe | 428/596 |
| 2014/0239443 A1* | 8/2014 | Gallagher et al. | 257/531 |

FOREIGN PATENT DOCUMENTS

| | | |
|---|---|---|
| JP | 6-65751 | 3/1994 |
| JP | 11-97444 | 4/1999 |
| JP | 2002-93747 | 3/2002 |
| WO | 02/83981 | 10/2002 |
| WO | 2004/067192 | 8/2004 |

OTHER PUBLICATIONS

Abstract of JP 04/297001, Oct. 1992; 2 pages.

* cited by examiner

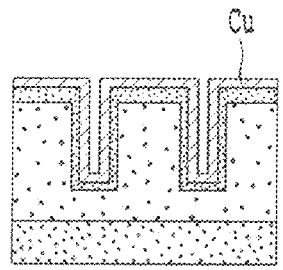
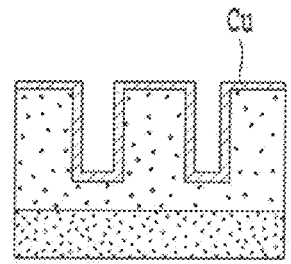

Conventional

Diagrammatic representation of conventional Cu metallisation method

FIG. 1A

New approach

Combined diffusion barrier and nucleation layer

FIG. 1B

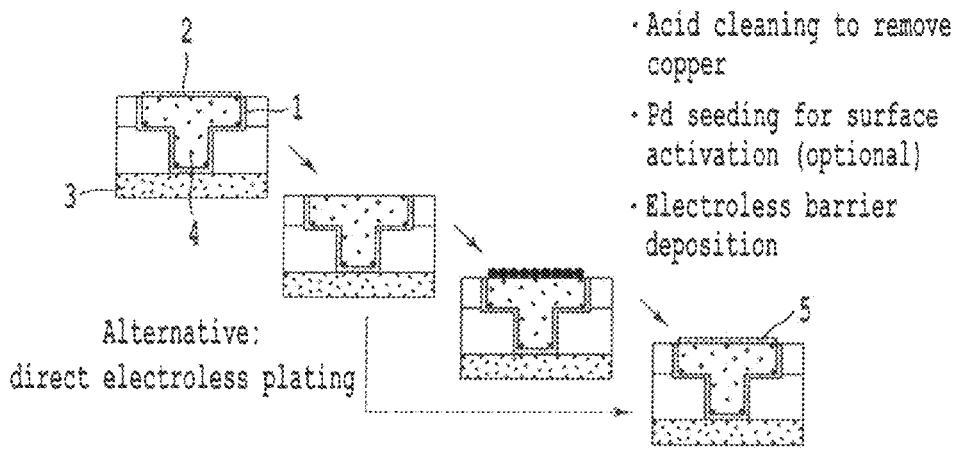

Diagrammatic representation of the selective encapsulation process on Cu surfaces via Pd nuclei activation or by the direct route without the intermediate step of Pd nucleus activation including surface pretreatment

FIG. 2

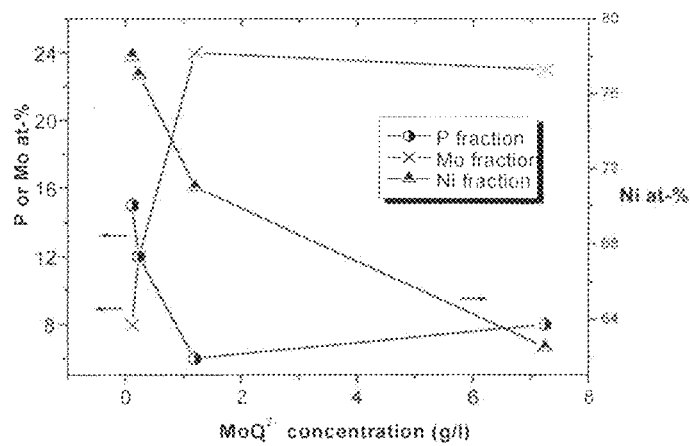
Figure 3: Effect of the concentration of sodium molybdate on the elemental composition of NiMoP three-component thin films

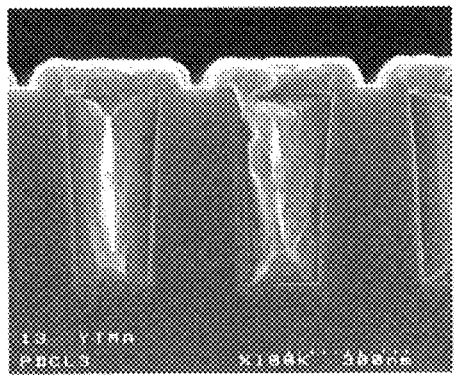 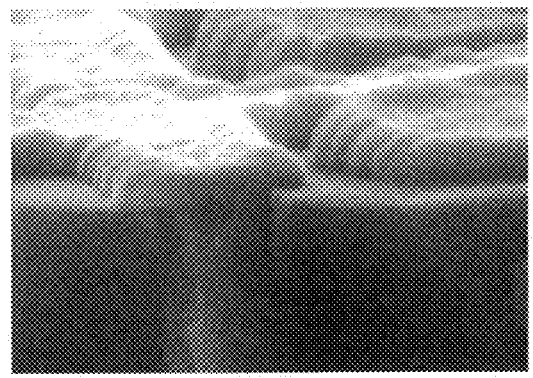
FIG. 6A  FIG. 6B
SEM photomicrographs of selectively encapsulated Cu damascene structures with Pd activation (a) and without Pd activation (b)
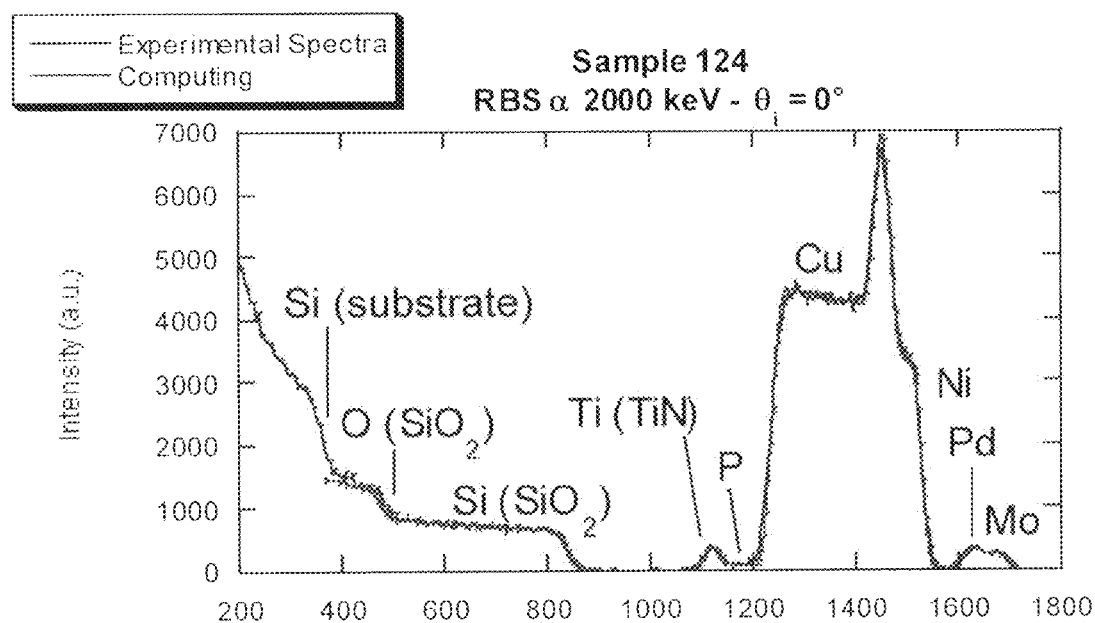
Figure 7: Composition of the deposited NiMoP layer of base electrolyte 1 with addition of 3.75 ppm of DTDGS and 75 ppm of Brij 58

COMPOSITIONS FOR THE CURRENTLESS DEPOSITION OF TERNARY MATERIALS FOR USE IN THE SEMICONDUCTOR INDUSTRY

This application is a divisional of U.S. Ser. No. 10/555,326, now U.S. Pat. No. 7,850,770, filed Nov. 3, 2005. U.S. Ser. No. 10/555,326 is a National Stage filing of PCT/EP04/04268, filed Apr. 22, 2004. Priority to German application 103 21 113.6 filed May 9, 2003 and German application 103 47 809.4 filed Oct. 10, 2003 is claimed.

The present invention relates to the use of ternary nickel-containing metal alloys of the NiMR type (where M=Mo, W, Re or Cr, and R=B or P), deposited by an electroless process, in semiconductor technology as barrier material or as selective encapsulation material. In particular, the present invention relates to a process for the production of ternary, nickel-containing metal-alloy layers by electroless deposition on semiconductor components, where they serve as barrier material or as selective encapsulation material for preventing the diffusion and electromigration of Cu.

PRIOR ART

Increasing interconnect density and speed requirements of micro-electronic components have resulted in the conductor track interconnect material being changed from conventional aluminium (alloys) to copper (Cu). The use of copper results in low electrical resistance and higher stability during electromigration, but at the expense of an increase in the overall resistance of the conductor tracks resulting from increasing interconnect density.

However, the use of Cu as interconnect material requires the use of so-called diffusion barriers due to its high diffusion activity into the substrate (silicon) or into insulating materials (for example $SiO_2$). These diffusion barriers are employed beneath the Cu interconnect for protection of the insulating material and for adhesion promotion between insulating layer and interconnect layer.

The high cycle frequencies during operation of these components cause an increase in the current densities, which can result in material separation of the electrical conductor material in the interconnects. This phenomenon, which is known as electromigration, results in high mortality of the components, which greatly impairs their performance.

The higher melting point of copper compared with aluminium enables an improvement in the current conduction properties of the conductor tracks, which results in increased resistance to electromigration failure.

The life and electromigration stability are dependent principally on possible material transport and exchange effects at the copper/insulating material interface and not on the arrangement of the crystal planes and the nature of the grain boundaries of the copper itself. The quality of the interfaces is therefore crucial with respect to material exchange.

It is known that the admixing (alloying) of further high-melting metals, such as, for example, refractory metals, further increases this stability. Improved electromigration behaviour can be achieved through the use of thin metallic layers in combination with copper.

These electrically conductive alloy layers simultaneously also function as diffusion barriers, which prevent the diffusion of Cu species and charge carriers. This barrier action is caused firstly by the morphological nature of the ternary alloys through the admixing of nonmetallic components, such as, for example, phosphorus, and secondly by blocking of the preferred diffusion paths along the grain boundaries within the alloy through the incorporation of foreign atoms.

A standard process for the production of components with copper interconnects is the so-called damascene method. In this, firstly the structures, such as conductor track trenches and contact holes, are formed in the insulating layer by lithographic processes and subsequent dry-etching processes. A diffusion barrier and an electrical contacting layer are subsequently applied to the conductor track structures by sputtering (PVD) or chemical vapour deposition (CVD) and filled by copper plating. Materials frequently employed for the production of diffusion barriers are tantalum, tantalum nitrides, titanium, titanium nitrides, tungsten and tungsten nitrides, etc. The electrical contact layer used is a thin layer of copper. Chemical-mechanical polishing is used to planarise the excess interconnect material.

With increasing aspect ratio (depth to width ratio of the conductor track structures), ever-thinner diffusion barriers have to be deposited in the conductor track trenches and contact holes. It is therefore becoming increasingly difficult to achieve a uniformly deposited thin-film layer of the barriers by methods such as PVD and CVD.

In addition, it is known that electromigration effects occur principally at the surface of Cu interconnects. This is due to the chemically modified surface structure of the copper, caused by attack during CMP and by oxidation processes.

The copper interconnects are generally built up on several levels. Since a barrier layer for the prevention of copper diffusion is not present on the surface of Cu, it is necessary to form a barrier layer, usually from non-conductive (dielectric) materials, such as silicon carbide (SiC) or silicon nitride (SiN), before the subsequent interconnect layer is deposited.

These dielectric materials, such as SiC or SiN, have a higher dielectric constant than $SiO_2$ and are applied over the entire surface of the conductor track structures by the current process. This ultimately results in an increase in the overall resistance of the semiconductor component, and it is thus advantageous to coat the surface of the copper interconnect material selectively by CMP.

Comparison of Methods

U.S. Pat. No. 4,019,910 describes mixtures and production methods for the deposition of nickel-containing ternary alloys. U.S. Pat. No. 5,695,810 claims a method for the electroless deposition of CoWP/metal barrier layers for use in the semiconductor industry. US Patent Application 2002/0098681 A1 furthermore describes the electroless deposition of ternary diffusion barriers and CoWB, CoMoB, CoWP or CoSnP encapsulation layers for improving the electromigration stability of novel integrated circuits with copper interconnects.

A device for electroless deposition and an autocatalytic electroplating method for similar ternary alloys consisting of nickel, cobalt, tungsten and molybdenum are described in US Application 2002/0036143 A1.

Amorphous ternary alloys of the CoWB, CoMoB and CoReB type and P-containing homologues thereof are claimed in U.S. Pat. No. 6,528,409 B1 for use for sealing the pores of special porous insulating materials integrated with copper interconnects.

JP-A 2002-93747 describes an electrically conductive structure consisting of CoWP, CoMoP, NiWP or NiMoP having a molybdenum content in an amount in the range from 0.2 to 2 atom-% by weight, and the production thereof, a component and the production thereof.

OBJECT

It is therefore an object of the present invention to provide compositions for the electroless deposition of an electrically conductive structure and a method for the production of this structure, including cleaning and activation steps, which enables structures to be deposited, after catalytic activation, on dielectrics (for example $SiO_2$, SiOC, SiN or SiC) or directly on the copper interconnect in a simple and inexpensive process, precisely structures which serve as barrier layer for preventing the diffusion of copper applied as interconnect material.

It is a further object of the present invention to provide suitable additives for uniform layer growth of the barriers, which simultaneously enables an extension of the bath service life of the electroless deposition baths in order to prevent spontaneous chemical decomposition due to the presence of reducing agents in aqueous solution.

The object is achieved by a process according to claim 1 and by a process in its particular embodiment according to claims 2 to 10. The object is also achieved by ternary nickel-containing metal alloys of the NiMR type (where M=Mo, W, Re or Cr, and R=B or P) deposited by an electroless process as barrier layer or as selective encapsulation material for preventing the diffusion and electromigration of Cu on semiconductor components, produced by a process according to Claims 1-10.

The present invention thus also relates to a composition for the electroless deposition of ternary nickel-containing metal alloys of the NiMR type (where M=Mo, W, Re or Cr, and R=B or P), which composition can be employed in a process according to Claims 1-10 and which comprises $NiSO_4 \times 6H_2O$, $Na_2WO_4$, $Na_2MoO_4$, $KReO_4$, $NaH_2PO_2$ or $CoSO_4 \times 7H_2O$ in aqueous solution in a suitable concentration and optionally further additives. Compositions according to the invention have, in particular, a pH in the range 4.5-9.0. If desired, these compositions may comprise additives selected from the group consisting of $Na_3C_6H_5O_7 \times 2H_2O$, $C_4H_6O_4$, $Na_2C_4H_4O_4 \times 6H_2O$, 2,2-bipyridines, thiodiacetic acid, dithiodiacetic acid, Triton X-114, Brij 58, dimethylaminoborane (DMAB), $Na_2C_2H_3O_2$, $C_3H_6O_3$ (90%), $NH_4SO_4$ and RE610 (RE610: sodium polyoxyethylene) phenyl ether phosphate).

The introduction of alternative materials for the conductor track interconnects and novel process steps represent a crucial condition for being able to achieve high signal transmission speeds in the chip, even in component structures of reduced size. The unavoidable use of diffusion barriers in the manufacturing process of copper multilevel interconnects with simultaneous integration of porous insulating materials enables a multiplicity of fundamental problems to be solved. This relates to the choice of the barrier materials themselves, but also to the choice of the electroless (autocatalytic) deposition process.

BRIEF DESCRIPTION OF THE DRAWINGS

FIG. 1A shows a diagrammatic representation of a conventional method;
FIG. 1B shows a combined diffusion and barrier layer according to an embodiment of the disclosure:
FIG. 2 shows a diagrammatic representation of a selective encapsulation process of the disclosure;
FIG. 3 shows the effect of the concentration of sodium molybdate on the elemental composition of NiMoP three-component thin films;
FIG. 6A shows SEM photomicrographs of selectively encapsulated Cu damascene structures with Pd activation;
FIG. 6B shows SEM photomicrographs of selectively encapsulated Cu damascene structures without Pd activation;
FIG. 7 shows the composition of a deposited NiMoP layer of base electrolyte with addition of 3.75 ppm of DTDGS and 75 ppm of Brij 58.

Figure 4A:
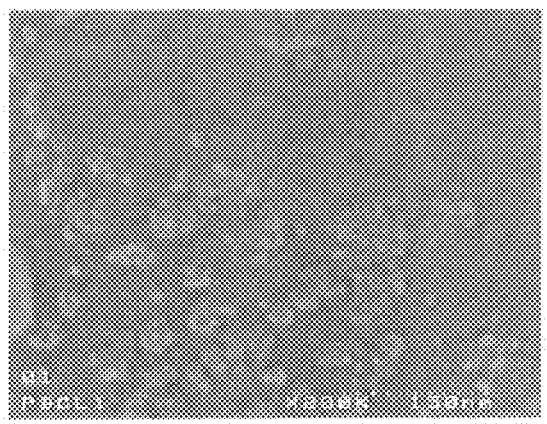
FIG. 4A shows a Cu substrate without post-CMP cleaning.

Attempts to achieve the present object have simultaneously resulted in the development of a novel process for cleaning and activation, for example by Pd catalyst nuclei. The conventional dual damascene structuring of copper conductor tracks and contact holes by the established method of copper electroplating (electrolysis) represents the boundary conditions here, limiting the choice and thus the integration of the materials and production process into the technological manufacturing process.

Barrier-layer thicknesses of less than 10 nm, as mentioned in the ITRS roadmap (International Technology Roadmap for Semiconductors 2002 Update, Interconnect, SIA San Jose, Calif., 2002, pp. 74-78) for the next CMOS technologies less than or equal to 90 nm, present a major challenge to the barrier material and the production technology with respect to deposition of such thin layers in a homogeneous layer thickness in structures having a high aspect ratio.

The crucial factor for operational reliability of a copper interconnect is the stability of the diffusion barrier, which is intended to prevent diffusion of copper species into the adjacent insulating interlayers and into the active transistor regions.

By specific optimisation of the composition, causing a high proportion by weight of refractory metals to be achieved in the alloys, optimisation of the morphology of the thin layers of the ternary diffusion barriers or top layers in the requisite thickness range is also achieved.

Cu is used as electrical conductor for the production of conductor track structures and is deposited on another material in this case. For delimiting this material from the Cu, a ternary electrically conductive NiMR metal alloy is employed as so-called diffusion barrier. If the underlying material is an insulator, catalytic activation takes place in order that NiMR can be deposited by an electroless process. If the underlying material is catalytically active and electrically conductive, for example sputtered Co metal, NiMR deposition can take place without prior activation. Cu for the Cu interconnect is subsequently applied by electroplating with the aid of the NiMR barrier layer deposited in this way functioning as cathode. This takes place directly on the barrier material without additional activation or application of an electrical contacting layer or nucleation layer.

A further application of nickel-containing alloy materials of this type consists in selective electroless deposition of NiMR barrier layer on the Cu conductor track structure for encapsulating the exposed Cu surface after CMP planarisation or dry-etching processes for the prevention of oxidation, induced thin-film stresses and improved electromigration stability. The NiMR layer growth is initiated by the substitution method, in which Pd catalyst nuclei (activation) are deposited on the copper surface. This type of initiation is necessary in electroless deposition by means of hypophosphite as reducing agent since the catalytic activity of copper is lower than that, for example, of Au, Ni, Pd, Co or Pt. In the conventional activation methods (reduction of Pd ions by oxidation of Sn ions, with Pd sol), it is difficult to produce a catalyst layer selectively on the copper interconnect. Pd nuclei adhere to the entire surface, and selective electroless deposition is not possible. The initiation of NiMR layer growth can also take place directly by modification of the electroless deposition solution by addition of a further reducing agent, such as, for example, DMAB, after prior cleaning, or deoxidation of the Cu surface.

In both applications, use of metallic diffusion barrier layers causes improved adhesion between the copper interconnect film and the barrier material.

The present invention provides compositions comprising additives for stabilisation of the developed mixtures for electroless deposition, i.e. additives for stabilisation of the thermodynamically metastable state. This causes an extension of the service life of the deposition bath. At the same time, the addition of these additives promotes constant and uniform layer growth in the process at the same time as a reduction in the dimensions of conductor tracks and contact holes in integrated components with increasing aspect ratios.

The present invention thus relates to a novel process for the production of an electrically conductive structure as barrier layer by electroless deposition on catalytically activated insulating layers, for example on $SiO_2$ activated with sputtered cobalt, for use as so-called combined diffusion barrier and nucleation layer beneath Cu interconnects, and for further use as encapsulation barrier on the copper interconnect surface.

This novel process is, in particular, characterised in that NiReP, NiMoP, NiWP, NiReB, NiMoB, NiWB, NiRePB, NiMoPB or NiWPB alloys are used as barrier layers.

The refractory metal fractions which increase the thermal stability of the barrier are present in these alloys in high atom-percentages, for example molybdenum with up to 24 at-%, Re with up to 23 at-% and tungsten with up to 15 at-%.

The present invention relates, in particular, to a process for the electroless deposition of a thin metal-alloy film on a surface of a metal substrate consisting of copper, where the process comprises the following steps:

cleaning (deoxidation) of the copper interconnect surface, if necessary subsequent activation of the interconnect surface, and provision of a pre-prepared autocatalytic plating solution, and subsequent spraying of the substrate with or dipping of the substrate into the pre-prepared chemical plating solution.

In particular, this is a process for the electroless deposition of a thin metal layer, where the metal of the thin metal-alloy film comprises a metal selected from the group consisting of Ni, Co, Pd, Ag, Rh, Ru, Re, Pt, Sn, Pb, Mo, W and Cr, preferably from the group consisting of Cu, Ag, Co, Ni, Pd and Pt.

The process is preferably carried out using autocatalytic plating solutions which are essentially free from surface-active substances.

However, the base solutions used can also be autocatalytic plating solutions comprising at least one surface-active substance. If desired, additives, such as stabilisers for extending the bath service lives of the electroplating solutions, can be added to the solutions.

It is also possible for additives for improving the layer properties and nature of the diffusion barriers to be added to the plating solutions used in the process.

Ammonia- and hydrofluoric acid-free mixtures can advantageously be employed in the process for the cleaning and activation of the Cu interconnect surfaces, for example by Pd catalyst nuclei.

Delimitation from the Prior Art

The aqueous, newly formulated compositions can be used for the electroless deposition of combined diffusion barrier and nucleation layers. The latter can take place in a single process step on use of the compositions according to the invention. However, the compositions can also be used for the deposition of encapsulation material on Cu interconnects.

The method of electroless deposition is particularly suitable for selective deposition of diffusion barriers on use of so-called porous insulating materials. It is known that conventional PVD methods and CVD precursors penetrate the relatively mechanically unstable pores of these materials, it being possible for these to be partially sealed or closed during deposition of the barrier.

The ternary alloy materials can be deposited by the process according to the invention using the novel compositions by electroless plating methods as very thin and efficient barrier films having a film thickness of less than 200 Å. They thus meet the requirements for conductor track dimensions in ultra large scale integrated (ULSI) circuits, with respect to surface nature, uniform step coverage and flank coating of the interconnects, to a greater extent than with conventional techniques.

A particular advantage of the specific application of these electrically conductive alloy materials as encapsulation layer consists in selective deposition of the barrier layers on Cu as interconnect material.

The high content of refractory metals, such as, for example, of up to 24 at-% of molybdenum, advantageously gives rise to improved diffusion barrier properties with respect to Cu diffusion.

An NiMoP alloy is a preferred material for electroless deposition on Cu since small amounts of Mo increase the thermal stability of the alloy and thus improve the diffusion resistance to copper.

The ternary barrier materials employed in accordance with the invention furthermore have high electrical conductivity with a low specific resistance of less than 250 µΩcm. This gives rise to a reduction in the signal transmission delay ("RC delay") as component structures become smaller.

The overall resistance of the conductor tracks and the probability of failure due to electromigration effects during operation of the components are minimised compared with dielectric materials, such as SiC or SiN, or in some cases even suppressed through a suitable choice of the process parameters, but also by continuous process monitoring.

The use of the electrically conductive ternary barriers according to the invention gives rise to improved interface quality with respect to the copper/metallic diffusion barrier/insulating matrix interfaces. Diffusion of copper species and electromigration phenomena are suppressed by an increased activation energy transition barrier at the metal/metal interface.

At the same time, the strong bond of metals to one another increases the adhesion of the barrier layer to the copper interconnect material and contributes to more advantageous production of finer interconnects, in contrast to original dielectric materials, such as SiC or SiN.

Furthermore, the modified composition ensures an extension of the bath service lives (stabilisation) of the electroless deposition baths according to the invention. At the same time, the morphology and layer growth of the deposited alloys are positively influenced with respect to the barrier action.

An extension of the service life of the deposition bath results in reduced consumption of chemicals. In addition, the work involved in the production process is reduced, and production costs are thus also lowered. Furthermore, the addition of additives promotes constant, uniform layer growth at the same time as a reduction in the dimensions of conductor tracks and contact holes in integrated components with increasing aspect ratios.

A further advantage of the present invention is to be seen in the method of electroless deposition of ternary alloys for the production of so-called combined diffusion barrier and nucleation layers in one process step from aqueous solution.

A resultant advantage is simplification of the process sequence with the elimination of individual process steps for the production of integrated circuits in semiconductor technology by enabling immediately subsequent electroplating with copper from aqueous solution (FIG. 1). A completely wet-chemical process procedure in wet-chemical cluster deposition units, as usually employed in the semiconductor industry, is thus possible (FIG. 1).

Copper is electroplated for interconnection on the ternary metal barrier layer as cathodic contacting. After the excess electrolytically deposited copper, which is located over the contact holes and interconnect trenches, has been removed, for example by chemical/mechanical polishing (CMP), the copper surface is cleaned. Catalyst nuclei can subsequently be deposited on the copper surface with the aid of a Pd-containing mixture by ion plating ("cementation", electrochemical deposition by charge exchange). This type of electrochemical charge exchange is not possible on the insulating layer. The catalyst nuclei thus subsequently enable selective electroless deposition of, for example, NiMoP only on the Cu interconnect, as described in the following working examples (FIG. 2) where reference numeral (1) corresponds with the diffusion layer, reference numeral (2) corresponds with the nucleation layer, reference numeral (3) corresponds with the catalytically activated insulating layer, reference numeral (4) corresponds with the copper interconnect and reference numeral (5) corresponds with the encapsulation barrier.

Variation Ranges of the Process Parameters, Including Preferred Ranges and Values Preferred concentration ranges are shown in the following tables.

TABLE 1

Compositions of electroless plating solutions and process parameters for the deposition of ternary NiP alloys

| Composition | Concentration [mol/l] | | |
|---|---|---|---|
| Operating conditions | NiWP | NiMoP | NiReP |
| $NiSO_4 \times 6 H_2O$ | 0.02-0.1 | 0.02-0.1 | 0.03-0.1 |
| $Na_2WO_4$ | 0-0.14 | — | — |
| $Na_2MoO_4$ | — | $0-3 \times 10^{-2}$ | — |
| $KReO_4$ | — | — | $0-1 \times 10^{-2}$ |
| $NaH_2PO_2$ | 0.1-0.5 | 0.1-0.5 | 0.2-0.8 |
| DMAB | — | $4 \times 10^{-3} - 1.5 \times 10^{-4}$ | — |
| $Na_3C_6H_5O_7 \times 2 H_2O$ | 0.07-0.22 | 0.1-0.3 | — |
| $C_4H_6O_4$ | — | 0.03-0.3 | 0.03-0.2 |
| $Na_2C_4H_4O_4 \times 6 H_2O$ | — | — | 0.1-0.5 |
| 2,2-Bipyridine | — | — | 1-5 ppm |
| Dithioacetic acid | — | 0-20 ppm | — |
| Triton X-114 | — | — | 0-200 ppm |
| Brij 58 | — | 0-100 ppm | — |
| pH | 8.2 | 9.0 | 4.5 |
| Temperature [° C. ± 1] | 60-80 | 60-80 | 60-65 |

TABLE 2

Compositions of electroless plating solutions and process parameters for the deposition of ternary boron-containing alloys

| Composition | Concentration [mol/l] | |
|---|---|---|
| Operating conditions | NiMoB | CoReB |
| $NiSO_4 \times 6 H_2O$ | 0.03-0.1 | — |
| $CoSO_4 \times 7 H_2O$ | — | 0.06-0.1 |
| $KReO_4$ | — | $0-3 \times 10^{-2}$ |
| $Na_2MoO_4$ | $3 \times 10^{-2}$ | — |
| DMAB | 0.05-0.2 | 0.05-0.2 |
| $Na_2C_4H_4O_4 \times 6 H_2O$ | 0.05-0.15 | 0.05-0.15 |
| $Na_2C_2H_3O_2$ | 0.1-0.3 | 0.1-0.3 |
| $C_3H_6O_3$ (90%) | 0.03-0.05 | 0.03-0.05 |
| $NH_4SO_4$ | 0.3-0.5 | 0.3-0.5 |
| 2,2-Bipyridine | 0-20 ppm | 0-20 ppm |
| RE610 | 0-200 ppm | 0-200 ppm |
| pH | 5.4 | 6.0 |
| Temperature [° C. ± 1] | 60-65 | 70-80 |

Critical Limits

For NiMoP, solutions in the working examples should have pH values of 9 and should not differ from this by more than ±1 since otherwise a modified alloy composition with different barrier properties results.

A buffer action is achieved by the suitable use of carboxylic acids and salts thereof as complexing agents.

The deposition temperature should not exceed the value of max. 90° C. since otherwise spontaneous decomposition of the autocatalytic plating solution would be the consequence. In general, increased deposition temperatures reduce the bath stability and thus bath service lives of the deposition solutions.

Variation of the Process or Procedure

The present invention provides a process for the production of electrically conductive structures by prior cleaning and activation steps. The cleaning sequence can optionally be extended by rinsing with alcohol, for example ethanol or isopropyl alcohol, in order to improve the cleaning action. The cleaning can also be supported by the use of a mechanical brush process ("scrubber").

The Pd activation solution can be prepared from salts, such as palladium chloride or palladium acetate.

The Pd activation solution can be varied by the addition of additives, for example by addition of complexing agents, such as EDTA or Quadrol (Quadrol: ethylenediamine-N,N, N',N'-tetra-2-propanol).

The Pd activation solution can be supplemented by additives, such as surface-active substances, for example Re610 or Triton X-114, or poly-ethylene glycols (Triton X-114: poly(oxyethylene) octyl phenyl ether or mono(1,1,3,3-tetramethylbutyl)phenyl)ether).

The Pd activation solution can be employed in both spraying and dipping processes.

The present invention formulates electroless deposition solutions for use in spraying or immersion processes which comprise at least one first metal component as main alloy constituent, a complexing agent, a reducing agent and a pH regulator, which sets the pH in the range from 4 to 12.

In a particular embodiment of the present invention, an electroless deposition solution is provided which comprises a second metal component which improves the barrier properties of the diffusion barrier. In addition to the first complexing agent, at least one further complexing agent from the group consisting of carboxylic acids and amino acids is selected.

The pH of the solutions is set to a pH in the range from 7 to 9 by addition of a hydroxide base, such as ammonium hydroxide, sodium hydroxide solution, potassium hydroxide solution or tetramethyl-ammonium hydroxide ($NH_4OH$, NaOH, KOH or TMAH respectively).

For applications on semiconductor components, the alkali-free bases, in particular, are preferred.

The pH can also be set to a pH in the range from 4 to 7 by the addition of a mineral acid.

Surfactants can optionally be used as additives in the broad sense. These can be both anionic (containing functional groups, such as carboxylate, sulfate or sulfonate groups) and nonionic (for example poly-ether chains) surfactants.

Additives which can be used are optionally 2,2-bipyridines, thiodiacetic acid, thiodiglycolic acid, dithiodiglycolic acid, ammonium thiolactate, ammonium thioglycolate, thioborates, boric acid, thiosulfates, sodium dithionite, borax, glycerol and hydroxyl and ammonium derivatives of benzene (for example 3,4,5-trihydroxybenzoic acid, hydroquinone, metol, p-phenylenediamine, Rodinal and Phenidone), both as individual components and in combination with one another.

If desired, inorganic salts, such as, for example, magnesium compounds, can also be employed as additives.

Areas of Application and Uses

The present invention provides compositions for electroless deposition baths having extended bath service lives (stabilisation of the thermodynamically metastable state). In accordance with the invention, the improved properties are achieved by the addition of suitable additives, as enumerated above. This extension of the service lives results in reduced consumption of chemicals and in addition reduces the work involved in the production process and thus also the costs of the resultant product. These additives also promote constant and uniform layer growth at the same time as a reduction in the dimensions of conductor tracks and contact holes in integrated components with increasing aspect ratios.

For the investigation of barrier materials (with respect to composition and microstructure), electroless deposition of ternary nickel-based alloys on $SiO_2$/Si wafers sputtered with 40 Å of cobalt was carried out. The acidic metal-deposition solution, which was used, for example, in order to deposit NiReP alloy, comprised $NiSO_4 \times 6\, H_2O$ 0.03-0.1 M, perrhenate 0.001-0.01 M, citric acid as complexing agent, hypophosphite as reducing agent and additives. The metal-deposition bath was operated within a temperature range of from 50 to 80° C. The thickness of the barrier layers varied between 10 and 30 nm. The encapsulating alloy films were analysed by four-point probe layer resistance measurements, Auger electron spectroscopy (AES), atomic force microscopy and X-ray diffraction (XRD). A study of the crystallographic structure of the thin films was carried out by XRD with glancing incidence. The barrier effectiveness on the silicon surface of the Cu barrier/$SiO_2$/Si systems was firstly characterised by scanning electron microscopy (SEM) using the selective Secco etching method. For analysis of copper surface activation, substrates having a layer sequence of Cu (150 nm)/TiN (10 nm)/$SiO_2$ (500-1000 nm) were used on Si wafers. The Cu surfaces were firstly prepared by cleaning with Inoclean 200™ post-CMP cleaning solution and then activated with Pd ion solution. Alternatively, this activation was used in order to allow self-aligned NiMoP barriers to grow (Inoclean 200™: mixture of dilute carboxylic acid esters and phosphoric acid). Alternatively, this cleaning may also be carried out using dilute HF solution, oxalic acid and other inorganic acids, for example sulfuric acid. Direct electroless metal deposition was achieved by direct addition of dimethylaminoborane (DMAB) to the electroless metal-deposition bath. The selectivity was assessed by energy dispersion X-ray measurements (EDX).

The aqueous deposition solutions were designed so as to give ternary alloys which comprise large amounts of high-melting metal component.

The elemental composition of the deposited Ni-based thin films was investigated by the AES depth profiling method.

Use as Combined Diffusion Barrier and Contact Layers:

The depth profiles of these layers indicate that nickel is deposited uniformly as a function of the depth, while phosphorus tends to be concentrated in the upper surface layer and the high-melting metals at the barrier/$SiO_2$ interface. The standardised atom fractions of nickel, phosphorus and high-melting metal component of the various alloys are shown. The nickel fractions remain relatively constant at approximately 60-70 at-%, while larger variations are measured for the remaining components, particularly phosphorus. All ternary alloys presented here comprise high proportions of high-melting metal, for example up to ~23 at-% for NiMoP thin films (Table 3).

During electroless deposition of polymetallic alloys from metal-deposition solutions containing hypophosphite or aminoborane, phosphorus (or boron) is deposited at the same time in the film layer as a result of a parallel oxidation reaction of the reducing agent [6].

The influence of the experimental conditions on the composition of the ternary alloy was investigated (FIG. 3). Factors which appeared to influence the thin-film composition were the type of high-melting metal and reducing agent used as well as the concentrations of the high-melting metals and complexing agents. As can be seen from the results, co-deposition of molybdenum occurs at the expense of phosphorus. The incorporation of large amounts of high-melting metal into the various three-component alloy films was therefore achieved by control of the respective concentrations of ions of high-melting metal in the solutions of the externally electroless deposition bath.

It has been suggested that the addition of high-melting metal improves the thermal stability of the deposits and the barrier properties by blocking diffusion paths along the grain boundaries [8]. The alloy was amorphous during deposition. In fact, many of the alloy films are amorphous and metastable during deposition, with their structure changing after post-thermal treatment.

In the case of NiMoP, a polycrystalline microstructure with microcrystallites embedded in an amorphous matrix has been described using XRD after conditioning. The resistance determined using the four-point probe technique for thin NiMoP films with a thickness of from 10 to 30 nm was determined as being in the range from 60 to 70 μΩcm. Such low resistance values are desired in order to minimise the contribution of the barrier layer to the total interconnect conduction resistance. The influence of the content of high-melting metal and accordingly of the co-deposited reducing-agent component and the associated thin-film microstructure on the properties of the diffusion barrier was investigated. The barrier effectiveness was assessed using Secco etching. It was found that thin layers of NiMoP with a thickness of 30 nm deposited by an electroless process were stable for 1 hour at up to 450° C.

Use for the Encapsulation of Copper Conductor Track Structures:

Regarding the use of the developed ternary alloys as metal barriers on Cu inlaid structures, a number of problems had to be assessed. The most crucial aspect is fully selective deposition on Cu structures. The nickel-based alloys investigated are preferred materials for avoiding layer separation of the Cu/self-aligned barrier interface, since Ni tends to form strong covalent bonds with Cu, which has a favourable effect on the adhesion of the boundary layers. In addition, preparation of the Cu surface and the stability of the electroless metal-deposition bath represent critical problems since the latter is in a metastable thermodynamic equilibrium and tends to decompose spontaneously. Preparation of the Cu surface therefore plays a key role in these catalytic processes. Before electroless alloy deposition, a wet process including removal of copper oxide by CMP and Pd catalyst activation was developed. Firstly, acid cleaning using post-CMP cleaning solution containing organic acids was carried out in order to remove copper oxide selectively. In a next step, the Cu surface was activated catalytically by deposition of a discontinuous Pd nucleation layer, which enabled electroless deposition of the ternary alloy using hypophosphite-containing metal-deposition solutions (FIG. 2).

TABLE 3

Composition of thin-film three-component alloy determined by AES depth profile analyses.

| Three-component alloy | M1 at-% | M2 at-% | R at-% |
|---|---|---|---|
| NiReP | ~70 | 8-23 | 14-19 |
| NiMoP | ~60 | ~24 | 6-10 |
| NiWP | 70-75 | ~15 | 7-19 |
| NiMoB | 65-70 | 7-13 | 13-17 |

Figure 4B:
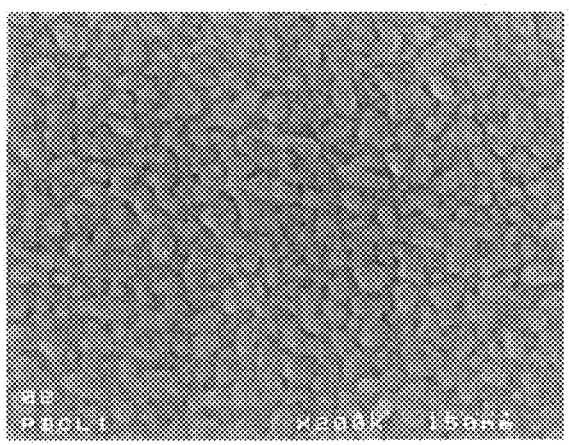
FIG. 4B shows a Cu substrate after cleaning for 2 minutes.
Figure 4C:
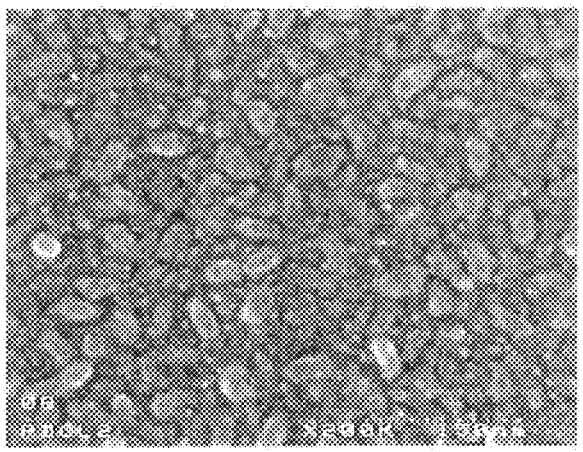
FIG. 4C shows a Cu substrate after cleaning for 2 minutes and Pd activation for 10 seconds.

The effect of each step of the activated process (cleaning of the surface, activation and deposition) was assessed with respect to surface morphology, surface composition and surface selectivity of the deposits. Before cleaning, CMP residues were observed (see FIG. 4a). After post-CMP cleaning for 2 minutes, these residues had been removed, with no reduction in the quality of the Cu surface (FIG. 4b). The subsequent activation step is very sensitive to surface cleaning, and dense Pd nucleation was achieved (FIG. 4c).

Figure 5A:
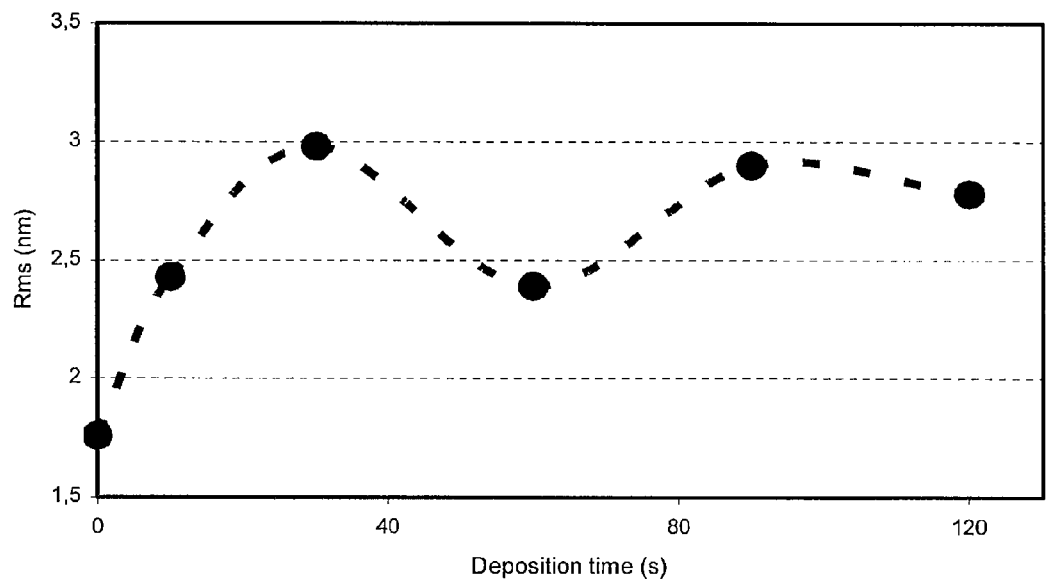
FIG. 5A shows Roughness as a function of the thickness.
Figure 5B:
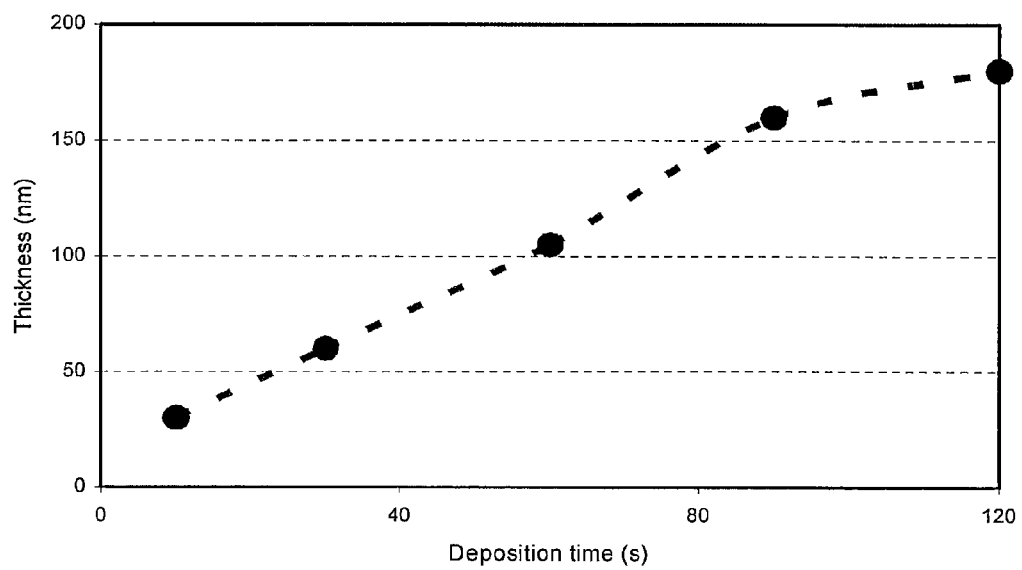
FIG. 5B shows Roughness as a function of the deposition time.

The effect on the surface roughness after cleaning and activation was investigated by AFM. The general tendency is that a longer cleaning treatment reduces the roughness of the Cu surface. This behaviour is also retained after activation. Pd nucleation is accompanied by surface roughening, which is ascribed to the deposition of isolated metal islets on the smooth Cu surface. It has been found that, of the conditions tested in this study, a cleaning treatment lasting 2 minutes gives satisfactory results. Grain growth of the deposited barrier films occurs at between 10 and 60 seconds in the initial stages of the electroless metal-deposition process investigated. The deposits change from a fine-grained structure to a morphology with a somewhat cauliflower-like structure [9]. This observation is supported by AFM measurements, which show surface roughening after 30 to 60 seconds in the early deposition stages without regular development (FIG. 5a). The barrier thickness is found to have a linear dependence on the deposition time, and a short deposition (20 seconds) is adequate to achieve the desired thickness. Short deposition times make the externally electroless process very attractive for manufacturing in which high throughputs are desired (FIG. 5b).

The selectivity of the electroless NiMoP deposition process on Cu surfaces was investigated by EDX against various non-conductive and barrier materials, such as, for example, $SiO_2$, SiC, SiOC, SiN, TiN and TaN. As can be seen from SEM and EDX measurements, selectivity was successfully achieved on cover substrates (Example 3). No deposition was observed on the other materials, apart from in the case of copper substrate, where the elements Cu, Ni, Mo and P were detected by EDX. Selective deposition during the developed electroless metal-deposition process on patterned substrates was detected. In general, optimum selectivity is achieved with short cleaning and activation times. FIG. 7a shows pictures of Cu damascene structures selectively encapsulated by the NiMoP alloy.

In general, activation by inoculation with Pd catalyst is necessary in order to initiate the electroless metal-deposition reaction on non-catalytic surfaces. In addition, however, the catalyst may be a potential source of contamination for the electroless metal-deposition bath and make the latter unstable during processing owing to the transfer of activator solution. In the case of conventional electroless metal deposition on Cu surfaces using hypophosphite compounds as reducing-agent component, it is not possible to achieve electroless metal deposition without prior Pd activation. In spite of the catalytic properties of Cu, hypophosphite does not reduce $Ni^{2+}$ or $Co^{2+}$ ions on the Cu surface. An electroless NiMoP deposition process on cleaned Cu substrates by the addition of 0.02-0.06 mol/l of DMAB to the metal-deposition bath without Pd activation was investigated, and selective encapsulation of Cu conductor track structures was observed (see FIG. 7b).

The three-component alloy films investigated, for example NiMoP, give significantly low resistance values and adhere well to Cu. Ultrathin deposits were achieved using an electroless deposition process. A diffusion barrier effectiveness has been demonstrated up to 450° C. The high selectivity of the electroless process makes these layers particularly attractive for use as post-CMP encapsulation. The use of these films as selective metal encapsulation layers can improve the electromigration reliability of integrated circuits made from copper compared with non-conductive encapsulation layers, such as, for example, SiN or SiC.

The following examples, which fall within the scope of protection of the present invention, are given for better understanding and in order to illustrate the invention. However, they are not suitable, owing to the general validity of the inventive principle described, for reducing the scope of protection of the present application only to these examples. Furthermore, the contents of the cited patent specifications should be regarded as part of the disclosure of the invention of the present description.

EXAMPLE 1

Step 1 (Cleaning)

The removal of adherent copper oxides and organic copper compounds from the copper surface is carried out using a post-copper CMP cleaning mixture, for example CuPure™ Inoclean 200 from Merck (consisting of 2-4% of dimethyl malonate, 2-4% of 1-methoxy-2-propanol, <0.5% of methyl acetate and <0.5% of phosphoric acid). The cleaning solution here can be employed as an 80% solution or diluted as an up to 10% solution by the dipping or spraying method. If desired, a further dipping step with ethanol or isopropanol can be carried out for cleaning. The alcohol can also be added directly to the cleaning mixture in order to eliminate the process steps.

Experimental Conditions:

Dipping time of 2 minutes into Inoclean 200 cleaning solution (dilution 10%), rinsed for 30 seconds with deionised water and not blown dry.

Spraying for 2 minutes with Inoclean 200 cleaning solution (dilution 10% and 50%), rinsed for 30 seconds with deionised water and not blown dry.

Using alcohols: dipping time of 2 minutes into Inoclean 200 cleaning solution (dilution 10%), rinsed for 30 seconds with deionised water, for 60 seconds with isopropyl alcohol and for 10 seconds with deionised water, and not blown dry.

Step 2 (Activation)

The Cu surface cleaned in this way is selectively activated by electrochemical charge exchange by treatment with a $Pd^{2+}$-containing solution.

Composition of the Activation Solution:
a.) Acetic acid 5.0 mol/l
    $PdCl_2$ $1 \times 10^{-3}$ mol/l
    HCl (37%, $1 \times 10^{-4}$ mol/l
b.) Acetic acid 5.0 mol/l
    $Pd(OAc)_2$ $1 \times 10^{-3}$ mol/l
    HCl (37%), $1 \times 10^{-3}$ mol/l Experimental Conditions:

The cleaning, activation and deposition steps of NiMR should be carried out in a sequence at very small time intervals.

The Cu surface is firstly dipped into diluted cleaning solution (10% or 50%), rinsed briefly with deionised water, dipped, without blow-drying, into a $Pd^{2+}$ solution for 10 seconds or 20 seconds and rinsed briefly with deionised water at room temperature. Blow-drying is not carried out.

Step 3 (Autocatalytic Deposition in Combination with Pd Activation)

The ternary metal alloy, for example NiMoP, is then deposited on the Cu interconnect surface activated with Pd nuclei.

For this purpose, stock solutions are prepared for a base electrolyte 1. The final deposition solution used is a volume of 250 ml. The stock solutions are mixed in the corresponding ratio.

Composition of Base Electrolyte 1:

| 26.29 g/l | $NiSO_4 \times 6H_2O$ | (0.1 mol/l) |
| 26.47 g/l | $Na_3$ citrate $\times 2H_2O$ | (0.09 mol/l) |
| 0.24 g/l | $Na_2MoO_4 \times 2H_2O$ | (0.001 mol/l) |
| 23.62 g/l | succinic acid | (0.2 mol/l) |
| 21.20 g/l | $NaH_2PO_2 \times H_2O$ | 0.2 mol/l |

Of the individual components, stock solutions are prepared whose concentration is selected in such a way that the solutions can be mixed with one another in equal volume ratios and give the respective base electrolytes. To this end, the substances are dissolved in deionised water in a 1 l volumetric flask.

Stock solution K1=131.5 g/l $NiSO_4 \times 6H_2O$
Stock solution K2=132.4 g/l $Na_3$ citrate$\times 2H_2O$
Stock solution K3=1.2 g/l $Na_2MoO_4 \times 2H_2O$ (for base electrolyte 1)
Stock solution K4=118.1 g/l succinic acid
Stock solution K5=106.0 g/l $NaH_2PO_2 \times H_2O$ In order to prepare the final deposition solution, firstly 50 ml of stock solution K1 and 50 ml of stock solution K2 are combined. In parallel, 50 ml of stock solution K3 and 50 ml of stock solution K4 are combined. The two mixtures are subsequently combined. The pH is adjusted to a value of 9.0 using 50% NaOH solution with stirring. Stock solution K5 is finally added.

Composition of Base Electrolyte 2:

| 26.29 g/l | $NiSO_4 \times 6H_2O$ | 0.1 mol/l |
| 26.47 g/l | $Na_3$ citrate $\times 2H_2O$ | 0.09 mol/l |
| 0.24 g/l | $Na_2MoO_4 \times 2H_2O$ | 0.001 mol/l |
| 1.18 g/l | succinic acid | 0.01 mol/l |
| 21.20 g/l | $NaH_2PO_2 \times H_2O$ | 0.2 mol/l |

Composition of Base Electrolyte 3:

| 26.29 g/l | $NiSO_4 \times 6H_2O$ | (0.1 mol/l) |
| 26.47 g/l | $Na_3$ citrate $\times 2H_2O$ | (0.09 mol/l) |
| 0.24 g/l | $Na_2MoO_4 \times 2H_2O$ | (0.001 mol/l) |
| 1.18 g/l | succinic acid | (0.01 mol/l) |
| 31.8 g/l | $NaH_2PO_2 \times H_2O$ | 0.3 mol/l |

Composition of Base Electrolyte 4:

| 26.29 g/l | $NiSO_4 \times 6H_2O$ | (0.1 mol/l) |
| 26.47 g/l | $Na_3$ citrate $\times 2H_2O$ | (0.09 mol/l) |
| 0.24 g/l | $Na_2MoO_4 \times 2H_2O$ | (0.001 mol/l) |
| 23.62 g/l | succinic acid | (0.2 mol/l) |
| 21.20 g/l | $NaH_2PO_2 \times H_2O$ | 0.2 mol/l |

Addition of Additives:

Additives can also be added to all base electrolytes 1 to 4. To this end, either
3.75 ppm of dithiodiglycolic acid or
75 ppm of Brij 58
individually or a combination of both is added before the pH is adjusted to 9.0.

Experimental Conditions:

After cleaning and Pd activation, the substrates are dipped into the electroplating solution (solution is stirred). The mixture is heated to 55° C. Autocatalytic deposition is carried out for 2 minutes. As soon as an NiMoP alloy is deposited on Pd nuclei, this becomes visible through a layer with a metallic lustre. After deposition of the alloy, the substrate is rinsed with deionised water and carefully blown dry using nitrogen gas.

EXAMPLE 2

Step 1 Cleaning as Under Example 1

Step 2 (Direct Autocatalytic Deposition without Pd Activation)

For direct electroless deposition of a metallic alloy (Ni-MoP) on copper surfaces, no activation via Pd catalyst nuclei takes place in this case. Instead, the NiMoP solution is modified by the addition of DMAB as initiator and employed for electroless deposition. In order to carry out the experiments, various borane concentrations in the range 0.004-0.15 mol/l are used.

Composition of base electrolyte 1 as described under step 3 with addition of:

Dimethylaminoborane=0.004 and 0.012 mol/l

Of the individual substances, stock solutions are prepared whose concentration is selected in such a way that the solutions are mixed in equal volume ratios and give the respective base electrolyte. To this end, the substances are dissolved in deionised water in a 1 l volumetric flask.

Stock solution K1=131.5 g/l $NiSO_4 \times 6H_2O$
Stock solution K2=132.4 g/l $Na_3$ citrate$\times 2H_2O$
Stock solution K3=1.2 g/l $Na_2MoO_4 \times 2H_2O$ (for base electrolyte 1)
Stock solution K4=118.1 g/l succinic acid
Stock solution "K5-1"=106.0 g/l $NaH_2PO_2 \times H_2O$+5.88 g/l dimethylaminoborane
Stock solution "K5-2"=106.0 g/l $NaH_2PO_2 \times H_2O$+17.69 g/l dimethylaminoborane After preparation of a mixture of K1-K4 which in each case consists of 100 ml of K1, K2, K3 and K4 and has been prepared in accordance with the experimental plan, 160 ml thereof and 40 ml of K5-1 are introduced into a beaker. For the experiments with solution K5-2, the mixture of K1-4 is prepared freshly. Again, 120 ml of K1-K4 are taken and 30 ml of K5-2 are added.

Experimental Conditions:

After cleaning, the substrates are rinsed for 30 seconds with deionised water. This is followed by an additional cleaning step in ethanol. The substrates are rinsed for 10 seconds with deionised water and subsequently dipped into the electroplating solution (solution is stirred). The deposition is carried out for 30 seconds with mixture K5-1 at 60° C. and with K5-2 at 50° C. As soon as NiMoP alloy is deposited on Pd nuclei, autocatalytic deposition takes place, which becomes visible through a layer with a metallic lustre. After deposition of the alloy, the substrate is rinsed with deionised water and carefully blown dry using nitrogen gas.

EXAMPLE 3

Determination of selective deposition vis-à-vis various insulating materials with Pd activation solution:

| Solution | | Substrate | Temperature | Time 1 | Time 2 | Time 3 | Time 4 |
|---|---|---|---|---|---|---|---|
| K1-K5 | 01 | Cu 01 | 55.4° C. | 120 sec | 30 sec | 10 sec | 120 sec |
| | 02 | Cu 02 | 55.4° C. | 120 sec | 30 sec | 10 sec | 120 sec |
| | 03 | SiO$_2$ 01 | 55.2° C. | 120 sec | 30 sec | 10 sec | 120 sec |
| | 04 | SiO$_2$ 02 | 55.2° C. | 120 sec | 30 sec | 10 sec | 120 sec |
| | 05 | SiN 01 | 55.2° C. | 120 sec | 30 sec | 10 sec | 120 sec |
| | 06 | SiN 02 | 55.4° C. | 120 sec | 30 sec | 10 sec | 120 sec |
| | 07 | SiOC 01 | 55.3° C. | 120 sec | 30 sec | 10 sec | 130 sec |
| | 08 | SiOC 02 | 55.3° C. | 120 sec | 30 sec | 10 sec | 120 sec |
| | 09 | SiC 01 | 55.4° C. | 120 sec | 30 sec | 10 sec | 120 sec |
| | 10 | SiC 02 | 55.4° C. | 120 sec | 30 sec | 10 sec | 120 sec |
| | 11 | TiN 01 | 55.4° C. | 120 sec | 30 sec | 10 sec | 120 sec |
| | 12 | TiN 02 | 55.4° C. | 120 sec | 30 sec | 10 sec | 120 sec |
| | 13 | TaN 01 | 55.3° C. | 120 sec | 30 sec | 10 sec | 120 sec |
| | 14 | TaN 02 | 55.3° C. | 120 sec | 30 sec | 10 sec | 120 sec |

Time 1: PCC-350
Time 2: deionised water
Time 3: activation
Time 4: deposition

For copper substrates K1-K5 01 and 02, deposition is observed, whereas no deposition on NiMoP takes place for the other substrates K1-K5 03 to 14.

EXAMPLE 4

Determination of selective deposition vis-à-vis various insulating materials by direct autocatalytic plating:

| Solution | | Substrate | Temperature | Time 1 | Time 2 | Time 3 |
|---|---|---|---|---|---|---|
| K1-K4 + K5-1 | 25 | TaN 01 | 59.3° C. | 120 sec | 30 sec | 120 sec |
| | 26 | TaN 02 | 59.6° C. | 120 sec | 30 sec | 120 sec |
| | 15 | TiN 01 | 60.2° C. | 120 sec | 30 sec | 30 sec |
| | 16 | TiN 02 | 60.2° C. | 120 sec | 30 sec | 30 sec |
| | 17 | SiO$_2$ 01 | 74.6° C. | 120 sec | 30 sec | 30 sec |
| | 18 | SiO$_2$ 02 | 75.6° C. | 120 sec | 30 sec | 30 sec |
| | 19 | SiC 01 | 75.3° C. | 120 sec | 30 sec | 30 sec |
| | 20 | SiC 02 | 74.4° C. | 120 sec | 30 sec | 30 sec |
| | 21 | SiN 01 | 73.5° C. | 120 sec | 30 sec | 30 sec |
| | 22 | SiN 02 | 72.6° C. | 120 sec | 30 sec | 30 sec |
| | 23 | SiOC 01 | 71.7° C. | 120 sec | 30 sec | 30 sec |
| | 24 | SiOC 02 | 70.8° C. | 120 sec | 30 sec | 30 sec |

Time 1: PCC-350
Time 2: deionised water
Time 3: deposition

Deposition was not observed in any of cases K1-K4+K5-1 15 to 26.

The invention claimed is:

1. A process for the production of an electrically conductive structure, comprising:
   (i) electrolessly depositing a first layer comprising at least one on at least one of a catalytically activated semiconductor layer and a catalytically activated insulating layer,
   (ii) depositing a copper interconnect on the first layer, and
   (iii) electrolessly depositing a second layer comprising at least one alloy on the copper interconnect,
   wherein the first layer is a diffusion barrier, and the second layer is an encapsulation barrier,
   to form an electrically conductive structure comprising (1) at least one of the catalytically activated semiconductor layer and the catalytically activated insulating layer, (2) the first layer, (3) the copper interconnect, and (4) the second layer, wherein the first layer and the second layer are adjacent the copper interconnect, and
   wherein an alloy in at least one of the first layer and the second layer comprises Mo, Re or W in an amount of from 2 to 25 at-% as a refractory metal which increases the thermal stability of the barrier layer, and
   wherein during the electroless depositing of the first layer a concentration of Mo in an electroless plating solution is $3 \times 10^{-2}$ mol/l or less, a concentration of W is $1 \times 10^{-1}$ mol/l or less and a concentration of Re is $1 \times 10^{-1}$ mol/l or less.

2. The process according to claim 1, wherein the electroless depositing forms at least one of the first layer and the second layer which comprise at least one of NiReP, NiMoP, NiWP, NiReB, NiMoB, NiWB, NiRePB, NiMoPB and NiWPB alloys.

3. The process according to claim 1, wherein, as the refractory metal, molybdenum is present in at least one of the first layer and the second layer in an amount of from 3 to 24 at-% or Re in an amount of from 2 to 23 at-% or tungsten in an amount of from 5 to 15 at-%.

4. The process according to claim 1, wherein the electroless deposition comprises depositing a thin metal-alloy film on a surface of a metal substrate, wherein the electroless deposition is carried out by spraying a semiconductor substrate with an autocatalytic plating solution or dipped into the autocatalytic solution, causing the electroless deposition of a thin metal-alloy film comprising at least one metal selected from the group consisting of Ni, Co, Pd, Ag, Rh, Ru, Re, Pt, Sn, Pb, Mo, W and Cr.

5. The process according to claim 4, wherein the metal substrate consists of a metal selected from the group consisting of Cu, Ag, Co, Ni, Pd and Pt.

6. The process according to claim 4, wherein the autocatalytic plating solution is essentially free from surface-active substances.

7. The process according to claim 4, wherein the autocatalytic plating solution comprises at least one surface-active substance and optionally at least one additive for improving the layer properties and nature of one of the first layer and the second layer.

8. The process according to claim 4, wherein the autocatalytic plating solution comprises one or more stabilisers for extending the bath service lives of the electroplating solutions.

9. The process according to claim 4, further comprising cleaning and activating one or more surfaces of the copper interconnect with ammonia- and hydrofluoric acid-free solutions.

10. The process according to claim 1, wherein the electroless depositing forms a first layer comprising at least one alloy selected from the group consisting of NiReP, NiReB, NiMoB, NiMoP, NiWB, NiRePB, NiMoPB and NiWPB.

11. The process according to claim 1, wherein the electroless depositing forms a second layer comprising at least one alloy selected from the group consisting of NiReP, NiReB, NiMoB, NiWB, NiMoP, NiRePB, NiMoPB and NiWPB.

12. A process for the production of an electrically conductive structure, comprising:
(i) electrolessly depositing a first layer comprising at least one alloy selected from the group consisting of NiRePB, NiMoPB and NiWPB on at least one of a catalytically activated semiconductor layer and a catalytically activated insulating layer,
(ii) depositing a copper interconnect on the first layer, and wherein the first layer is a diffusion barrier,
to form an electrically conductive structure comprising (1) at least one of the catalytically activated semiconductor layer and the catalytically activated insulating layer, (2) the first layer, and (3) the copper interconnect, wherein the first layer is adjacent the copper interconnect.

13. The process of claim 12, wherein the alloy comprises at least one of Mo, Re and W in an amount of from 2 to 25 at-%.

14. The process according to claim 12, wherein the first layer comprises from 3 to 24 at-% of Re.

15. The process according to claim 12, wherein the first layer comprises Mo in an amount of from 3 to 24 at-%.

16. The process according to claim 12, wherein the first layer comprises W in an amount of from 5 to 15 at-%.

17. A process for the production of an electrically conductive structure, comprising:
(i) cleaning and/or activating a copper interconnect with at least one of chemical mechanical planarization, an ammonia-free solution and a hydrofluoric acid-free solution, and
(ii) electrolessly depositing an encapsulation layer on the cleaned and/or activate copper interconnect, wherein the encapsulation layer comprises at least one alloy selected from the group consisting of NiRePB, NiMoPB and NiWPB,
to form an electrically conductive structure wherein the encapsulation layer is adjacent the copper interconnect.

18. The process of claim 17, wherein the alloy comprises at least one of Mo, Re and W in an amount of from 2 to 25 at-%.

19. The process according to claim 17, wherein the encapsulation layer comprises Mo in an amount of from 3 to 24 at-%.

20. The process according to claim 17, wherein the encapsulation layer comprises Re in an amount of from 2 to 23 at-%.

21. The process according to claim 17, wherein the encapsulation layer comprises W in an amount of from 5 to 15 at-%.

\* \* \* \* \*